US007753560B2

(12) United States Patent
Xu et al.

(10) Patent No.: US 7,753,560 B2
(45) Date of Patent: Jul. 13, 2010

(54) LED LAMP WITH A HEAT SINK ASSEMBLY

(75) Inventors: Fang-Wei Xu, Shenzhen (CN); Guang Yu, Shenzhen (CN); Cheng-Tien Lai, Taipei Hsien (TW)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 284 days.

(21) Appl. No.: 11/967,027

(22) Filed: Dec. 29, 2007

(65) Prior Publication Data
US 2009/0097241 A1   Apr. 16, 2009

(30) Foreign Application Priority Data
Oct. 10, 2007   (CN) .................... 2007 1 0123807

(51) Int. Cl.
*F21V 29/00* (2006.01)
*F21S 4/00* (2006.01)
(52) U.S. Cl. ............... 362/294; 362/373; 362/249.02; 362/311.02; 362/545; 362/547
(58) Field of Classification Search ................ 362/580, 362/545, 547, 218, 249.02, 294, 311.02, 362/373
See application file for complete search history.

(56) References Cited

U.S. PATENT DOCUMENTS

| 4,715,438 | A | 12/1987 | Gabuzda et al. | |
|---|---|---|---|---|
| 7,252,405 | B2 * | 8/2007 | Trenchard et al. | 362/235 |
| 7,434,964 | B1 * | 10/2008 | Zheng et al. | 362/294 |
| 7,513,653 | B1 * | 4/2009 | Liu et al. | 362/294 |
| 7,568,817 | B2 * | 8/2009 | Lee et al. | 362/294 |
| 7,581,856 | B2 * | 9/2009 | Kang et al. | 362/373 |
| 2005/0174780 | A1 | 8/2005 | Park | |
| 2006/0001384 | A1 | 1/2006 | Tain et al. | |
| 2006/0109661 | A1 * | 5/2006 | Coushaine et al. | 362/373 |
| 2007/0159828 | A1 * | 7/2007 | Wang | 362/294 |
| 2007/0230172 | A1 * | 10/2007 | Wang | 362/249 |
| 2007/0253202 | A1 * | 11/2007 | Wu et al. | 362/294 |
| 2008/0253125 | A1 * | 10/2008 | Kang et al. | 362/294 |
| 2009/0016062 | A1 * | 1/2009 | Lee et al. | 362/294 |
| 2009/0016072 | A1 * | 1/2009 | Lee et al. | 362/373 |
| 2009/0046464 | A1 * | 2/2009 | Liu et al. | 362/294 |

* cited by examiner

*Primary Examiner*—Ismael Negron
(74) *Attorney, Agent, or Firm*—Jeffrey T. Knapp

(57) ABSTRACT

An LED lamp includes a heat absorbing member having a hollow, cylindrical configuration, a lamp base, a plurality of LED modules and a heat sink. The heat absorbing member defines a through hole therein. The heat sink is secured to a top portion of the heat absorbing member. The lamp base is secured to a bottom portion of the heat absorbing member. The LED modules are mounted on an outer sidewall of the heat absorbing member, and each of the LED modules includes a printed circuit board and a plurality of LEDs mounted on the printed circuit board. Each of the heat pipes has an evaporating portion received in an inner sidewall of the heat absorbing member and a condensing portion connecting with the heat sink. The condensing portions of the heat pipes are radially arranged on the heat sink, radiating outwardly from a central point of the heat sink.

17 Claims, 5 Drawing Sheets ly, like reference numerals designate corresponding parts throughout the several views.

LED LAMP WITH A HEAT SINK ASSEMBLY

BACKGROUND OF THE INVENTION

1. Field of the Invention

The present invention relates to a light emitting diode (LED) lamp, and more particularly to an LED lamp with a heat sink assembly having heat pipes for improving heat dissipation of the LED lamp.

2. Description of Related Art

LED (light emitting diode) lamps are highly energy efficient electrical light sources, and are increasingly being considered for indoor or outdoor lighting purposes. In order to increase the overall lighting brightness, a plurality of LEDs is often incorporated into a signal lamp, which can lead to significant problems of overheating.

Conventionally, an LED lamp comprises a cylindrical body functioning as a heat sink, a plurality of LEDs mounted on an outer wall of the body and a transparent envelope mounted around a periphery of the body of the LED lamp and forming an enclosed housing for the LED lamp. When the plurality of LEDs is activated at the same time, a quick rise in temperature of the LED lamp is resulted. Heat generated by the LEDs is accumulated in the enclosed housing formed by the envelope; thus, operation of the LED lamps has a problem of instability because of the rapid buildup of heat. Consequently, the light from the LED lamp often flickers, which degrades the quality of the illumination. Furthermore, the LED lamp is used in a high heat state for a long time and the life time thereof is consequently shortened.

What is needed, therefore, is an LED lamp which can overcome the above-mentioned disadvantages.

SUMMARY OF THE INVENTION

An LED lamp for lighting purpose includes a heat absorbing member having a hollow, cylindrical configuration, a lamp base, a plurality of LED modules and a heat sink. The heat absorbing member defines a through hole therein. The heat sink is secured to a top portion of the heat absorbing member. The lamp base is secured to a bottom portion of the heat absorbing member and configured for mounting the LED lamp to a lamp socket. The LED modules are mounted on an outer sidewall of the heat absorbing member, and each of the LED modules includes a printed circuit board and a plurality of LEDs mounted on the printed circuit board. Each of the heat pipes has an evaporating portion received in an inner sidewall of the heat absorbing member corresponding to one of the LED modules and a condensing portion connecting with the heat sink. The condensing portions of the heat pipes are radially arranged on the heat sink, radiating outwardly from a central point of the heat sink.

Other advantages and novel features of the present invention will become more apparent from the following detailed description when taken in conjunction with the accompanying drawings, in which:

BRIEF DESCRIPTION OF THE DRAWINGS

Many aspects of the present apparatus can be better understood with reference to the following drawings. The components in the drawings are not necessarily drawn to scale, the emphasis instead being placed upon clearly illustrating the principles of the present apparatus. Moreover, in the drawings, like reference numerals designate corresponding parts throughout the several views.

DETAILED DESCRIPTION OF THE INVENTION

Figure 1:
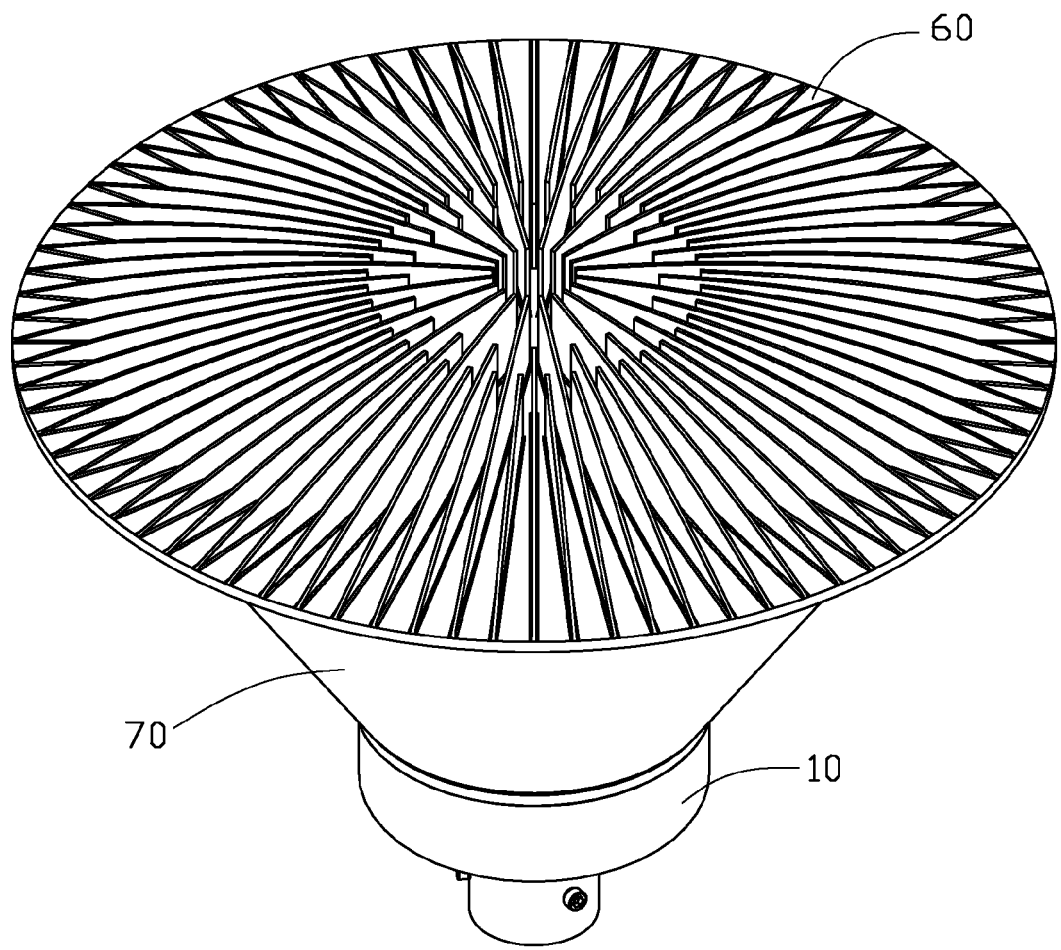
FIG. 1 is an assembled, isometric view of an LED lamp with a heat sink assembly in accordance with a preferred embodiment of the present invention.
Figure 2:
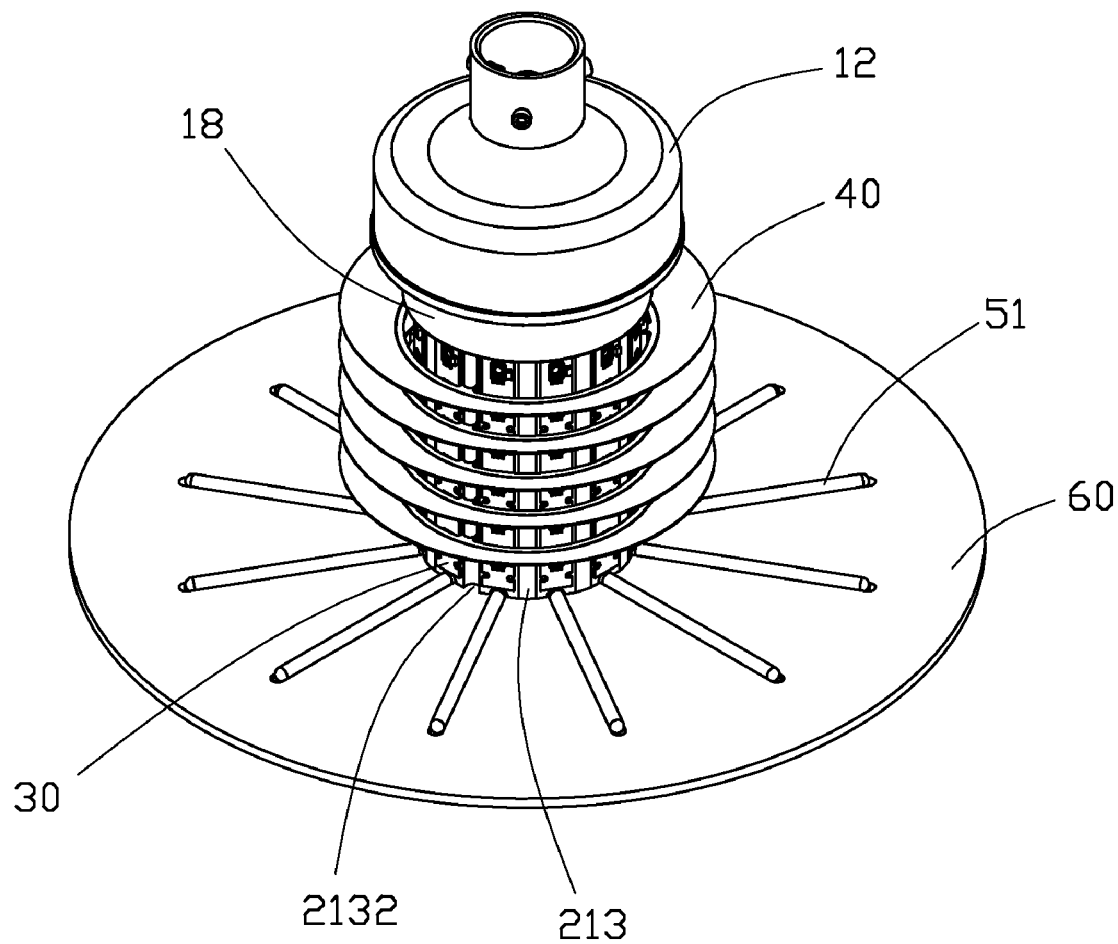
FIG. 2 is a partly assembled view of FIG. 1, wherein an envelope of the LED lamp is taken away for clarity.
Figure 3:
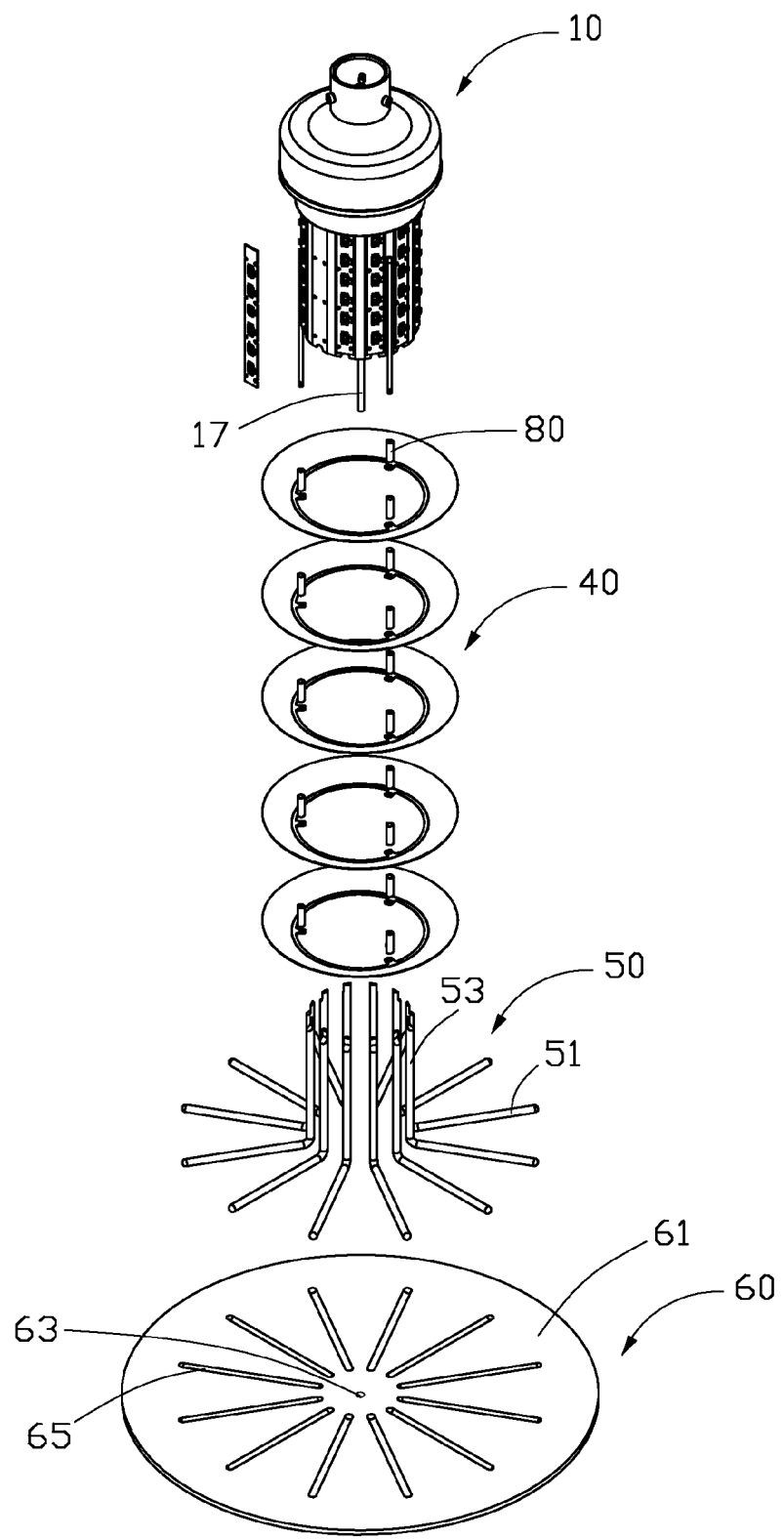
FIG. 3 is an exploded view of FIG. 1, wherein the envelope of the LED lamp is taken away.

Referring to FIGS. 1-3, an LED lamp for a lighting purpose comprises a plurality of LED modules 30, a heat absorbing member 20 supporting and cooling the LED modules 30, five reflectors 40 mounted around the heat absorbing member 20, a heat sink 60 located at a top of the heat absorbing member 20 and a plurality of heat pipes 50 connecting the heat sink 60 with the heat absorbing member 20 and a lamp base 10 secured to a bottom portion of the heat absorbing member 20. An envelope 70 is mounted between the heat sink 60 and the lamp base 10 to enclose the heat absorbing member 20, the LED modules 30, the reflectors 40 and the heat pipes 50 therein. The envelope 70 is made of transparent material, such as glass or plastic.

The lamp base 10 comprises a lamp holder 12, a driving circuit module 14 received in the lamp holder 12, a connecting member 16 mounted on a top portion of the lamp holder 12 and a sleeve 18 located on the connecting member 16. The lamp holder 12 has a standard configuration for fitting in a standard lamp socket. The connecting member 16 has a disc-shaped configuration, comprising a protrusive cylindrical mounting portion 161 located at a centre thereof, and a gasket 163 mounted at a circumferential edge thereof. A top plate of the mounting portion 161 defines a central hole 1612 therein. Four through holes 1614 are disposed around the central hole 1612 and three through holes 1616 are located at the edge of the top plate of the mounting portion 161 and equidistantly spaced from each other. Three screw holes 165 and four mounting holes 167 are defined in the connecting member 16 and around the mounting portion 161. Four fasteners (not shown) are used to extend through the through holes 1614 to be fixed on the top plate of the mounting portion 161. An elongated bolt 17 extends through the central hole 1612 of the mounting portion 161 and is fixed on the mounting portion 161. The sleeve 18 has three tabs 181 equidistantly disposed at a top portion thereof. The tabs 181 extend inwardly from an edge of the sleeves 18. Each tab 181 defines a through hole (not labeled) therein. The sleeve 18 is mounted on the connecting member 16 for receiving the mounting portion 161 therein. Four screws (not shown) are used to extend through the mounting holes 167 to threadedly engage in four threaded posts (not labeled) in the lamp holder 12 to thereby secure the connecting member 16 on the lamp holder 12. Wires (not shown) are used to extend from the driving circuit module 14 through the through holes 1616 of the mounting portion 161 to electrically connect with the LED modules 30.

Figure 5:
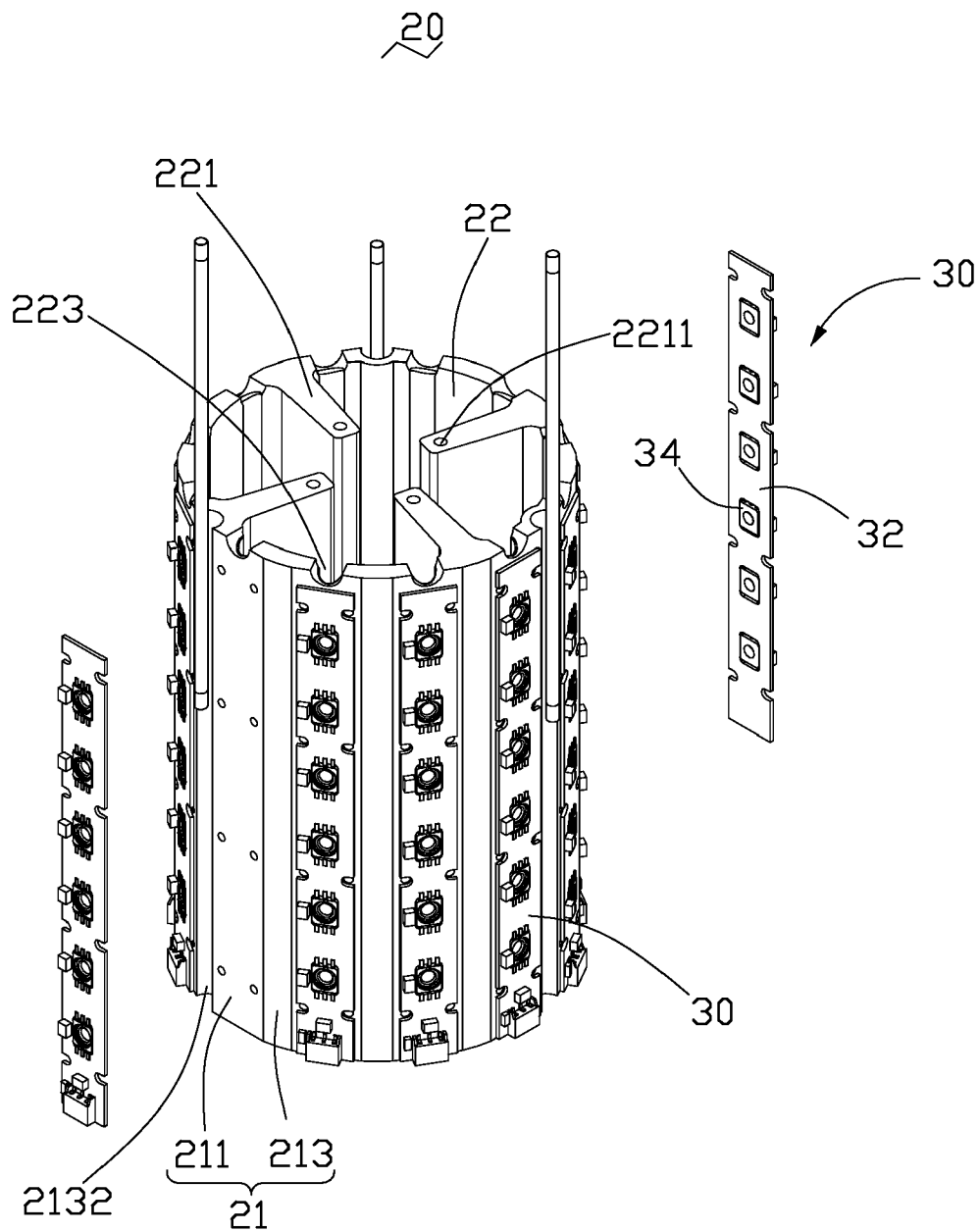
FIG. 5 is an enlarged view of a heat absorbing member of FIG. 4.

Referring to FIG. 5 also, the heat absorbing member 20 is integrally formed of a metal with good heat conductivity such as aluminum or copper. The heat absorbing member 20 has a hollow cylindrical configuration. An outer sidewall 21 of the heat absorbing member 20 comprises a plurality of first and second elongated rectangular facets 211, 213 connected each other. Each of the first rectangular facets 211 is wider than each of the second rectangular facets 213. The first and second rectangular facets 211, 213 are alternate with each other. Three semicircular grooves 2132 are evenly defined in the heat absorbing member 20 and located corresponding to three second rectangular facets 213 for receiving three poles 90 therein, respectively.

The heat absorbing member 20 defines a through hole (not labeled) in a center thereof, thereby forming a cylindrical inner sidewall 22. Four cantilevers 221 extend inwardly from the inner sidewall 22 and along a central axis of the heat absorbing member 20 from top to bottom. The cantilevers 221 are centrosymmetric relative to the central axis of the heat absorbing member 20. The four cantilevers 221 are located equidistantly from each other and corresponding to four second elongated facets 213, respectively. Each cantilever 221 has a mounting hole 2211 defined in an inner end thereof, corresponding to the through holes 1614 of the connecting member 16. The fasteners to be fixed on the mounting portion 161 of the connecting member 16 are used to engage in the mounting holes 2211 of the cantilevers 221 to thereby fix the heat absorbing member 20 to the lamp base 10. The elongated bolt 17 extends upwardly through a center of the through hole of the heat absorbing member 20 with an upper portion of the elongated bolt 17 being located beyond a top of the heat absorbing member 20.

The inner sidewall 22 located corresponding to the first facets 211 of the outer sidewall 21 defines a plurality of semicircular grooves 223. The grooves 223 extend along the central axis of the heat absorbing member 20, for receiving the heat pipes 50 therein, respectively. Three grooves 223 are defined between two cantilevers 221 and two of the grooves 223. A quantity of the grooves 223 can be different in an alternative embodiment. In this embodiment, the quantity of the grooves 223 is designed to be twelve. The numbers of the grooves 223, the heat pipes 50 and the LED modules 30 are all twelve.

Each LED module 30 comprises an elongated printed circuit board 32 and six evenly spaced LEDs 34 mounted on a front side of the printed circuit board 32. The LEDs 34 of each LED module 30 are arranged along a longitudinal direction of the printed circuit board 32. Each LED module 30 is mounted in a thermally conductive relationship with each the first rectangular facets 211 of the outer sidewall 21 of the heat absorbing member 20.

Each reflector 40 has a disc-shaped configuration, and an opening (not labeled) is defined in a center thereof. An inner edge of the reflector 40 equidistantly forms three tabs 41, and an inner end of each tab 41 defines a mounting hole 411 therein. Each reflector 40 is mounted around the printed circuit boards 32. The reflectors 40 are equidistantly disposed at the periphery of the heat absorbing member 20 by a plurality of collars 80 aligned with the tabs 41 of the reflectors 40. The collars 80 are received in the grooves 2132 of the heat absorbing member 20. A plurality of elongated poles 90 extends through the collars 80, the corresponding mounting holes 411 of the tabs 41, and the mounting holes of the tabs 181 of the sleeve 18. Bottom ends of the elongated poles 90 threadedly engage in the corresponding screw holes 165 of the connecting member 14 of the lamp base 10 and top ends of the elongated poles 90 engage with nuts (not shown). Thus, the reflectors 40 are secured to the periphery of the heat absorbing member 20. In this state, the collars 80 near the lamp base 10 rest on the mounting tabs 181 of the sleeve 18. The reflectors 40 improve the illumination of the LED lamp by redirect light rays generated by the LEDs 34 into a more consistently outward and downward direction.

Figure 4:
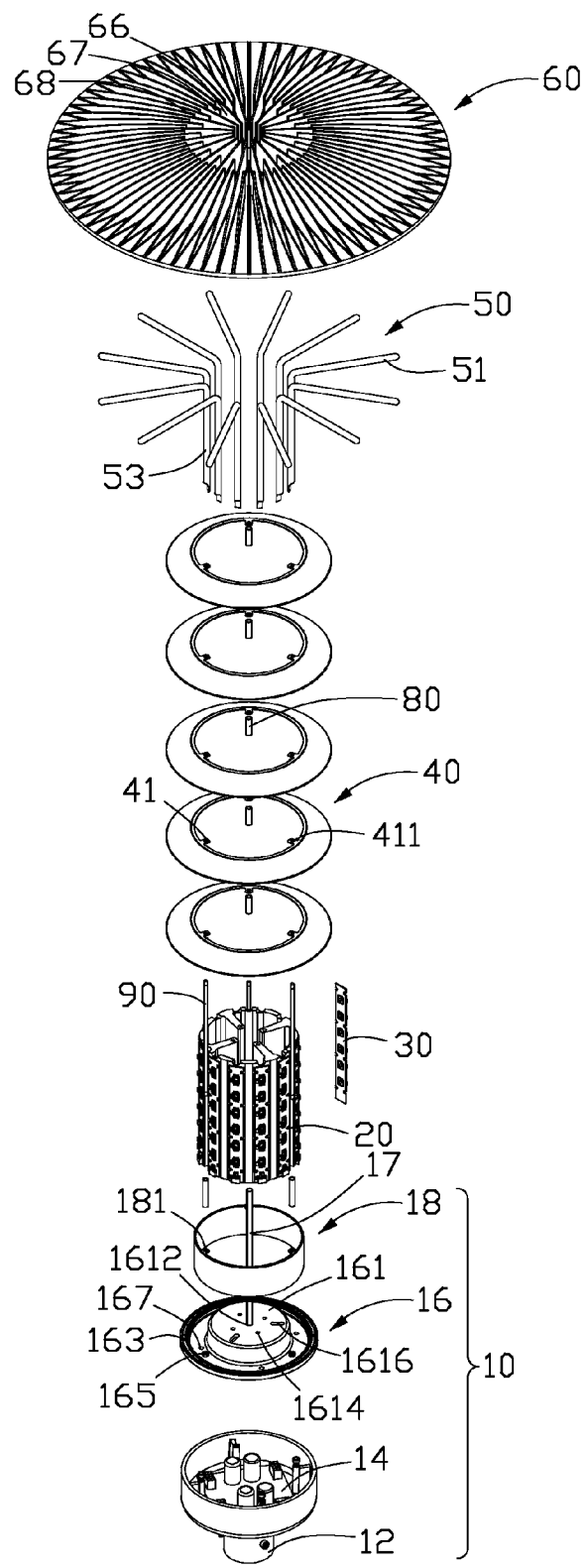
FIG. 4 is a view similar to FIG. 3, but shown from another aspect.

Referring to FIGS. 3-4 again, each of the heat pipes 50 has an L-shaped configuration and comprises an evaporating portion 51 and a condensing portion 53. The evaporating portions 51 are received in the grooves 223 of the heat absorbing member 20 and parallel to each other. The condensing portions 53 radially extend outwardly from the top of the heat absorbing member 20.

The heat sink 60 has a disc-like configuration and is made of metal such as aluminum. The heat sink 60 comprises a base 61. A screw hole 63 is defined in a centre of the base 61. A bottom of the base 61 defines twelve radial grooves 65 around the screw hole 63 to receive the condensing portions 53 of the heat pipes 50 therein. A plurality radial first, second and third fins 66, 67, 68 are mounted on a top surface of the base 61 around the screw hole 63. The first, second and third fins 66, 67, 68 extend inwardly from an outmost edge toward the screw hole 63. Each of the first fins 66 has a length longer than that of each of the second fins 67, and each of the second fins 67 has a length longer than that of each of the third fins 68. The first fins, second fins and third fins 66, 67, 68 are spaced from each other with a predetermined distance which gradually decreases from the outmost edge of the base 61 of the heat sink 60 to the screw hole 65 of the base 60. The first, second and third fins 66, 67, 68 are so arranged that each second fin 67 is sandwiched between two corresponding third fins 68 which are in turn sandwiched between two corresponding first fins 66. On the other hand, each third fin 68 is sandwiched between a corresponding first fin 66 and a corresponding second fin 67. The evaporating portion 53 of the heat pipe 50 is soldered in the corresponding groove 65 of the heat sink 60; simultaneously the elongated bolt 17 extends through the screw hole 63 of heat sink 60 and threadedly engages with a nut (not shown) to mount the heat sink 60 on the top of the heat absorbing member 20.

The envelope 70 has a bugle-shaped construction, with top and bottom openings (not labeled) therethrough. The top opening has a diameter larger than that of the bottom opening. The top opening of the envelope 70 engages with the base 61 of the heat sink 60 and the bottom opening of the envelope 70 engages with the gasket 163 of the connecting member 16 of the lamp base 10. Therefore, the lamp base 10, the heat sink 60 and the envelope 70 together define an enclosed housing (not labeled) accommodating the LED modules 30 therein, whereby the LED modules 30 can have a sufficient protection from a damage caused by an unexpected force acting on the LED lamp.

When the LEDs 34 emit light, heat generated by the LEDs 34 is conducted to the heat absorbing member 20. Due to use of the heat pipes 50, the heat of absorbed by the heat absorbing member 20 can be conducted to the evaporating portions 51 rapidly, then transferred to the first, second and third fins 66, 67, 68 mounted on the heat sink 60 via the condensing portions 53 of the heat pipes 50 received in the base 61 of the heat sink 60, and finally dispersed into ambient cool air via the fins 66, 67, 68 of the heat sink 60. Therefore, temperature of the enclosed housing defined by the lamp base 10, the heat sink 60 and the envelope 70 can be timely lowered. Thus it can be seen that the LED lamp has an improved heat dissipating configuration for preventing the LEDs 34 from overheating.

It is believed that the present invention and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. An LED lamp adapted for lighting purpose comprising:
   a hollow, cylindrical heat absorbing member with a through hole defined therein from top to bottom thereof;
   a lamp base secured to a bottom portion of the heat absorbing member, the lamp base being adapted for mounting the LED lamp to a lamp socket;
   a plurality of LED modules being mounted on an outer sidewall of the heat absorbing member, each of the LED modules comprising a printed circuit board and a plurality of LEDs mounted on the printed circuit board;
   a heat sink secured to a top portion of the heat absorbing member; and
   a plurality of heat pipes having evaporating portions received in an inner sidewall of the heat absorbing member corresponding to the LED modules, respectively, and condensing portions contacting with the heat sink;
   wherein the outer sidewall of the heat absorbing member comprises a plurality of alternated first and second elongated, rectangular facets, and the LED modules are mounted on the first rectangular facets; and
   wherein the inner sidewall of the heat absorbing member has a plurality of equidistant cantilevers formed thereon, the cantilevers being located corresponding to some of the second rectangular facets, a plurality of fasteners being fixed on the lamp base and extending through the cantilevers to mount the heat absorbing member on the lamp base.

2. The LED lamp of claim 1 further comprising an elongated bolt fixed on the lamp base and extending through the heat absorbing member and threadedly engaging with the heat sink to mount the heat sink on the heat absorbing member.

3. The LED lamp of claim 1, wherein each of the heat pipes has an L-shaped configuration.

4. The LED lamp of claim 1 further comprising an envelope located between the lamp base and the heat sink and cooperating therewith to form an enclosed housing for accommodating the LED modules therein.

5. The LED lamp of claim 1, wherein the lamp base comprises a driving circuit module received therein, for electrically connecting with the LED modules.

6. The LED lamp of claim 1 further comprising a plurality of spaced reflectors mounted around the LED modules.

7. The LED lamp of claim 6, wherein the reflectors are spaced from each other by a plurality of collars located therebetween, elongated poles engaging with the lamp base and extending upwardly through the collars and the reflectors to engage nuts, whereby the reflectors are fixedly mounted around the heat absorbing member.

8. The LED lamp of claim 7, wherein each of the reflectors has a disc-shaped configuration.

9. The LED lamp of claim 1, wherein the heat sink has a disc-shaped configuration and comprises a base and a plurality radial first, second and third fins extending inwardly from an outmost edge of a top the base, and each of the first fins has a length longer than that of each of the second fins and each of the second fins has a length longer than that of each of the third fins.

10. The LED lamp of claim 9, wherein the first fins, second fins and third fins are spaced from each other with a predetermined distance which gradually decreases from the outmost edge of the base to a centre of the base of the heat sink.

11. The LED lamp of claim 10, wherein each of the third fins is sandwiched between corresponding first and second fins.

12. The LED lamp of claim 11, wherein the condensing portions of the heat pipes are mounted onto a bottom of the base of the heat sink.

13. An LED lamp comprising:
   a hollow heat absorbing member having an inner wall and an outer wall;
   a plurality of LED modules mounted on the outer wall of the heat absorbing member;
   a lamp base mounted to an end of the heat absorbing member, adapted for mounting the LED lamp to a lamp socket;
   a heat sink mounted to an opposite end of the heat absorbing member;
   a plurality of heat pipes each having an evaporating portion thermally connecting with the inner wall of the heat absorbing member and a condensing portion thermally connecting with the heat sink; and
   a plurality of reflectors spaced from each other along an axial direction of the heat absorbing member and surrounding the heat absorbing member;
   wherein the heat sink has a disc-shaped configuration with a center and the condensing portions of the heat pipes are radially arranged on the heat sink and radiate outwardly from the center of the heat sink; and
   wherein each of the heat pipes has an L-shaped configuration.

14. The LED lamp of claim 13 further comprising an envelope located between the heat sink and the lamp base and enclosing the heat absorbing member and the LED modules therein.

15. The LED lamp of claim 13, wherein the heat sink further comprises a plurality of fins radially outwardly extending from the center of the heat sink.

16. The LED lamp of claim 15, wherein the fins have different lengths.

17. An LED lamp adapted for lighting purpose comprising:
   a hollow, cylindrical heat absorbing member with a through hole defined therein from top to bottom thereof;
   a lamp base secured to a bottom portion of the heat absorbing member, the lamp base being adapted for mounting the LED lamp to a lamp socket;
   a plurality of LED modules being mounted on an outer sidewall of the heat absorbing member, each of the LED modules comprising a printed circuit board and a plurality of LEDs mounted on the printed circuit board;
   a heat sink secured to a top portion of the heat absorbing member;
   a plurality of heat pipes having evaporating portions received in an inner sidewall of the heat absorbing member corresponding to the LED modules, respectively, and condensing portions contacting with the heat sink; and
   a plurality of spaced reflectors mounted around the LED modules;
   wherein the reflectors are spaced from each other by a plurality of collars located therebetween, elongated poles engaging with the lamp base and extending upwardly through the collars and the reflectors to engage nuts, whereby the reflectors are fixedly mounted around the heat absorbing member.

* * * * *